United States Patent [19]

Nakayama

[11] Patent Number: 4,558,288

[45] Date of Patent: Dec. 10, 1985

[54] EMITTER-FOLLOWER TYPE SEPP CIRCUIT

[75] Inventor: Kazuaki Nakayama, Tokyo, Japan

[73] Assignee: Pioneer Electronic Corporation, Tokyo, Japan

[21] Appl. No.: 599,024

[22] Filed: Apr. 11, 1984

[30] Foreign Application Priority Data

Apr. 28, 1983 [JP] Japan ................................. 58-75943

[51] Int. Cl.$^4$ .............................................. H03F 3/26
[52] U.S. Cl. ..................................... 330/268; 330/274
[58] Field of Search ............... 330/263, 267, 268, 271, 330/274

[56] References Cited

U.S. PATENT DOCUMENTS

| | | | |
|---|---|---|---|
| 4,306,199 | 12/1981 | Kondou | 330/274 X |
| 4,370,623 | 1/1983 | Nagasawa | 330/267 |
| 4,439,743 | 3/1984 | Schwarz et al. | 330/267 |

*Primary Examiner*—James B. Mullins
*Assistant Examiner*—Steven J. Mottola

*Attorney, Agent, or Firm*—Sughrue, Mion, Zinn, Macpeak & Seas

[57] ABSTRACT

An emitter-follower type SEPP circuit in which, by detecting idle currents and distortion components and feeding such signals back to an error amplifier in a real time mode, a very stable circuit with little crossover distortion is provided. The input signal is applied through opposite-polarity bias potential sources to noninverting first terminals of first and second error amplifiers, one for the positive half cycle and the other for the negative half cycle. The outputs of the two error amplifiers are applied through constant current sources to bases of respective bipolar transistors, the emitters of which are connected in a feedback arrangement to noninverting input terminals of the two amplifiers. The emitters of the two bipolar transistors are further connected through a resistance network to an output terminal. The resistance network also has a feedback terminal, which is connected through third and fourth bias potential sources to respective noninverting input terminals of the two amplifiers.

7 Claims, 10 Drawing Figures

$C_1, C_2$: CURRENT GENERATING UNIT

EMITTER-FOLLOWER TYPE SEPP CIRCUIT

BACKGROUND OF THE INVENTION

The present invention relates to a cutoffless class B emitter-follower type SEPP (Single Ended Push-Pull) circuit.

In general, an emitter-follower type SEPP circuit is operated in class B for reason of efficiency. In order to provide a smooth transition between upper and lower transfer characteristics, the establishment of idle current flows is essential. In such an ordinary circuit, when one of the transistors is turned on, the other transistor is cut off, as a result of which switching distortion occurs. In order to overcome this difficulty, a cutoffless class B circuit is generally employed in which, with the aid of a servo circuit, neither of the transistors is cut off to cause certain amounts of idle current to flow at all times. In this case, it is true that the switching distortion is eliminated. However, there is still present current distortion due to the nonlinear, exponential current transfer characteristics of the transistors, and also a voltage distortion attributed thereto.

Furthermore, in the case of bipolar transistors, the presence of idle currents may lead to thermal runaway in the absence of temperature compensation. Yet further, the idle current value tends to vary according to the presence or absence of a signal or the ambient temperature. Thus, the operating point changes over both long and short periods of time irrespective of the presence or absence of the signal.

The aforementioned temperature compensation is extremely critical. Therefore, it is considerably difficult to design a circuit having adequate temperature compensation. Especially in the conventional cutoffless class B circuit, the idle currents have low stability because of the presence of negative feedback. This, together with the fact that it is difficult to perform complete temperature compensation because of the nature of the circuit, increases the difficulty in design.

FIG. 1 shows the fundamental arrangement of a conventional cutoffless class B SEPP circuit. In FIG. 1, $A_1$ and $A_2$ designate error amplifiers whose gain is unity or less; $B_1$ and $B_2$, voltage generating circuits, or voltage adders; C, an input signal source; and $V_B$, bias sources for transistors $Q_1$ and $Q_2$.

In FIG. 1, the currents $i_{E1}$ and $i_{E2}$ flowing during "silent" periods in which no signal is applied to the input terminal IN are the idle currents $I_d$. Currents $I_{B1}$ and $I_{B2}$ are supplied by the power sources $V_B$. Each idle current $I_d$ has a level:

$$I_d = \frac{V_B - V_{BE}}{R_E}, \quad (1)$$

ps where $V_{BE}$ is the base-emitter voltage of the transistor and $R_E$ is the emitter resistance. When an input signal current $i_i$ flows, the current $i_{E1}$ is increased to:

$$i_{E1} = h_{fe1} \cdot i_i,$$

where $h_{fe1}$ is the current amplification factor of the transistor $Q_1$.

The input voltage $V_{i1}$ to the amplifier $A_1$ is:

$$V_{i1} = (V_{BE} - V_B) + i_{E1} \cdot R_E$$
$$= (V_{BE} - V_B) + h_{fe1} \cdot i_i \cdot R_E.$$

If the amplifier $A_1$ were not provided, this voltage would cut off the transistor $Q_2$ by reversely biasing the base. However, due to the presence of the amplifier $A_1$ having a gain of unity, the voltage $v_{i1}$ is positively fed back to the base of the transistor $Q_1$ to raise its potential, and therefore a certain amount of idle current $I_d$ always flows without reversely biasing the transistor $Q_2$. In the case also where the input signal current $i_i$ is inverted in polarity to turn on the transistor $Q_2$, the same operation is carried out and the transistor $Q_1$ is not cut off. This is the operation of a cutoffless class B SEPP circuit.

FIG. 2 shows a current transfer characteristic with respect to the input signal current in the circuit of FIG. 1. In general, when the emitter current of a transistor increases, the current amplification factor $h_{fe1}$ decreases abruptly, and accordingly the combined characteristic curve is considerably nonlinear as indicated in FIG. 2, and hence a large current distortion is caused. If the gains of the amplifiers $A_1$ and $A_2$ are unity as described above, then the positive feedback percentage is 100%, and therefore the action of stabilizing the idle current $I_d$ due to the presence of the resistor $R_E$ is completely lost. This is equivalent to the fact that $R_E$ becomes zero in the above-described expression (1). Accordingly, the idle current becomes unstable, thus resulting in an oscillation. In practice, the gains of the amplifiers $A_1$ and $A_2$ are set to less than unity; however, the idle current is still unstable with temperature.

If to eliminate the distortion caused by the current transfer characteristic, a constant voltage drive circuit is formed by removing the amplifiers $A_1$ and $A_2$ from the cutoffless class B SEPP circuit and employing a constant voltage source as the input signal source C, the transfer characteristic is as shown in FIG. 3. Even in this case, the distortion attributed to the exponential transfer characteristic of the transistors remains unchanged.

In the conventional class B SEPP circuit employing the constant voltage drive method, (1) distortion arising due to the exponential function transfer characteristic and switching distortion attributed to the on-off operation of the output transistor are produced. Even in the cutoffless class B SEPP circuit, (2) distortion due to the current transfer characteristic occurs as described above. In addition, in any drive method, (3) temperature compensation is required for the idle current, and even when this is provided, it is impossible to completely compensate the idle current. (4) It takes a long period of time (more than thirty minutes or so) for the idle current to become constant after the power switch has been turned on. (5) The idle current varies depending on whether or not an input signal is present, and the magnitude of the idle current is greatly shifted from the set value when a large signal has been inputted. (6) Because of the above-described drawbacks (3) through (5), the operating point is unstable, varying with the ambient temperature and the presence or absence of the input signal.

SUMMARY OF THE INVENTION

Accordingly, an object of the invention is to provide a cutoffless class B emitter-follower type SEPP circuit in which the above-described various difficulties have been eliminated and no temperature compensation is necessary for the idle current.

In accordance with the invention, the idle currents and the distortion components of the class B SEPP circuit are detected in a real time mode simultaneously and fed back by error amplification. Accordingly, the distortion at the SEPP output terminal can be greatly decreased, it is unnecessary to provide temperature compensation for the idle currents, and the idle currents are stabilized immediately after the power switch is turned on. Furthermore, even when a large signal is applied, the idle currents can be stabilized to the set value immediately. In addition, the output impedance can be greatly reduced. Accordingly, even when a signal is caused to reversely flow to the output terminal, the front stage is substantially unaffected thereby because of the high absorbing capacity. Moreover, in the cutoffless class B SEPP circuit provided by the invention, no switching distortion occurs. Thus, the SEPP circuit of the invention, unlike the conventional circuit, has very little distortion and high stability.

DESCRIPTION OF THE PREFERRED EMBODIMENTS

Figure 1:
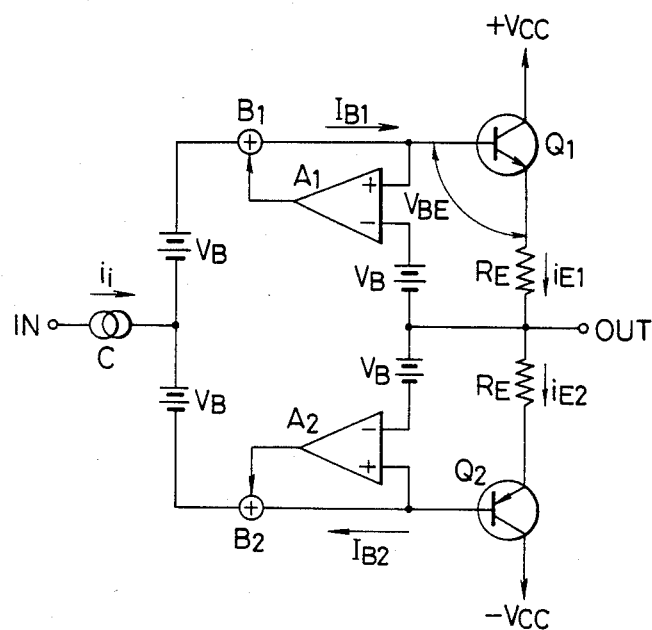
FIG. 1 is a circuit diagram showing an example of a conventional cutoffless class B SEPP circuit.
Figure 2:
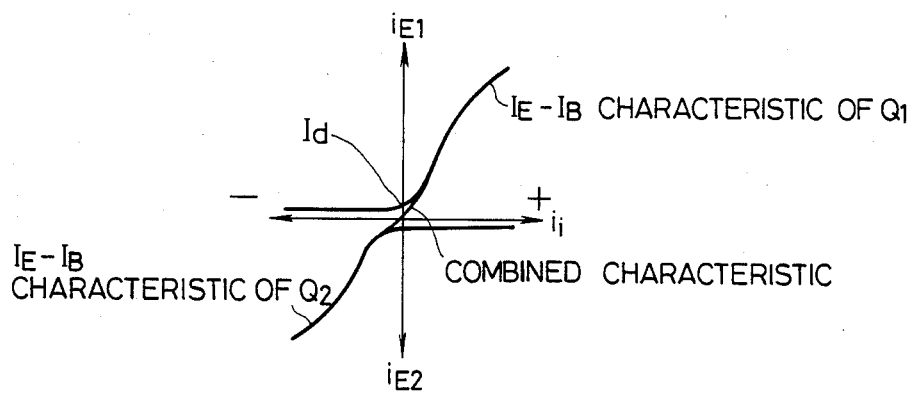
FIG. 2 is a graphical representation indicating characteristics of the circuit in FIG. 1.
Figure 3:
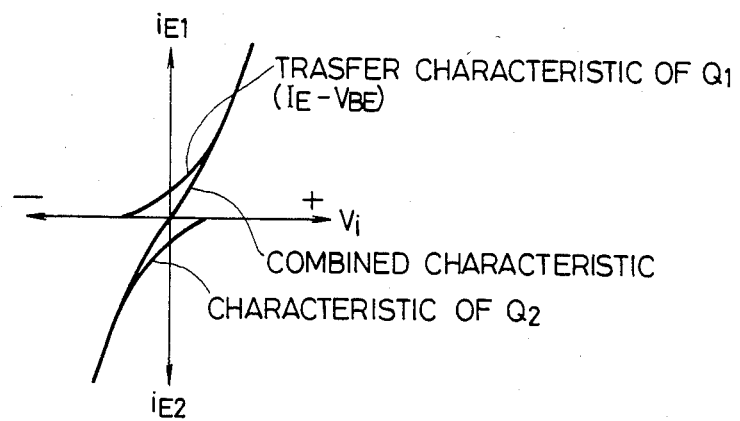
FIG. 3 is a graphical representation showing characteristics of another example of a conventional circuit.

The invention will be described with reference to FIGS. 4 through 10, in which those components which have been previously described with reference to FIG. 1 are designated by the same reference characters or numerals.

Figure 4:
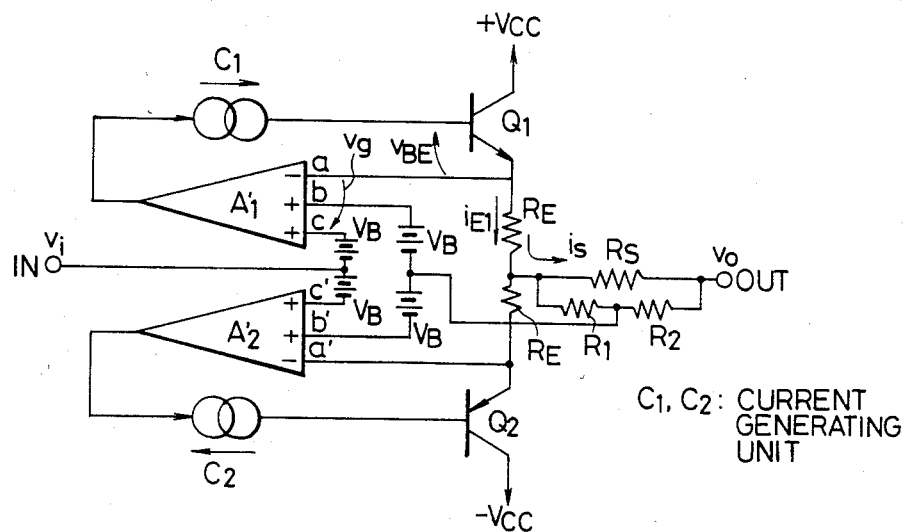
FIG. 4 is a circuit diagram showing the fundamental arrangement of a cutoffless class B SEPP circuit according to the invention.

The fundamental arrangement of a cutoffless class B emitter-follower type SEPP circuit according to the invention is shown in FIG. 4. This SEPP circuit includes error amplifiers $A_1'$ and $A_2'$ which have input terminals a, b and c, and a', b' and c', respectively. The emitters of output transistors $Q_1$ and $Q_2$ are coupled to two series-connected resistors $R_E$. The junction point of these resistors $R_E$ is connected through a resistor $R_S$ to an output terminal OUT. The emitters of the output transistors $Q_1$ and $Q_2$ are connected, as idle current detecting terminals, to the input terminals a and a' of the error amplifiers $A_1'$ and $A_2'$, respectively. The input terminals c and c' are connected through bias sources $V_B$ to an input terminal IN. A series circuit of resistors $R_1$ and $R_2$, which have much higher resistance values than the resistor $R_S$, forms a voltage divider circuit for detecting a signal output current. This voltage divider circuit is connected in parallel with the resistor $R_S$. The junction point of the resistors $R_1$ and $R_2$ is connected through bias sources $V_B$ to the input terminals c and b' of the error amplifiers $A_1'$ and $A_2'$, respectively. The outputs of the amplifiers $A_1'$ and $A_2'$ are applied to current generating units, which are drive current sources for the transistors $Q_1$ and $Q_2$, as a result of which drive currents for the transistors $Q_1$ and $Q_2$ are produced.

When a negative signal is applied across the input terminals a and c of the amplifier $A_1'$, the input terminal b is opened. When a negative signal is applied across the input terminals b and a, the input terminal c is opened. On the other hand, when a positive input signal is applied across the input terminals a' and c' of the amplifier $A_2'$, the input terminal b' is opened. When a positive input signal is applied across the input terminals b' and a', the input terminal c' is opened.

Accordingly, a feedback loop is formed with the terminals c and c' of the amplifiers $A_1'$ and $A_2'$ as signal input terminals and with the terminals a and a' as feedback input terminals. Therefore, the idle current $I_d$ provided during silent periods can be expressed by:

$$I_d = V_B/R_E. \qquad (2)$$

When a positive signal is inputted, the input terminal b is opened because a negative signal is forcibly applied to the input terminals a and c, and hence the output voltage $v_o$ is:

$$v_o = v_i - i_s(R_E + R_S) - v_g, \qquad (3)$$

where $v_i$ is the input voltage, $i_s$ is the signal current, and $v_g$ is the input voltage applied across the terminals a and c.

If the composite transfer conductance of the amplifier $A_1'$ and the current generating unit $C_1$ is represented by $gm_1$, and the input resistance of the transistor $Q_1$ by $hie_1$, then the base-emitter voltage variation $V_{BE}$ is as follows:

$$V_{BE} = gm_1 \cdot hie_1 \cdot v_g. \qquad (4)$$

From expression (3) and (4):

$$v_o = v_i - i_s(R_E + R_S) - \frac{V_{BE}}{gm_1 \cdot hie_1}. \qquad (5)$$

When $gm_1 \cdot hie_1$ is large in expression (5), then the term $V_{BE}$, which is a distortion term because of the exponential transfer characteristic, is effectively eliminated. Accordingly, in the case of a linear load, $i_s$ is not distorted, and accordingly $v_i$ is similar to $v_o$ and the distortion is eliminated. This effect is provided by the comparison and amplification of the input and output by the error amplifiers.

On the other hand, in the operation of the amplifier $a_2'$, as a signal which is positive by $(R_E \cdot i_s + v_g)$ is applied across the terminal b' and a', the input terminal c' is opened. Accordingly, the amplifier $A_2'$ becomes an error amplifier with the terminals b' and a' acting as input terminals. When $R_1 = 0$, the idle current $I_d$ is as follows:

$$I_d = V_B/R_E.$$

This equation is the same as equation (2) above.

In practice, the gain of the amplifier $A_2'$ is not infinite, and hence $I_d$ is smaller than that defined by the above equation. Therefore, the resistor $R_1$ is inserted in the circuit so that an extra bias $$\left(\frac{R_1}{R_1 + R_2} i_s \cdot R_S\right)$$

is added to the bias $V_B$ to complement the idle current $I_d$.

In the case where a negative signal are applied to the input terminal IN, the operation is completely the same as described above, although the signs are changed.

Figure 5:
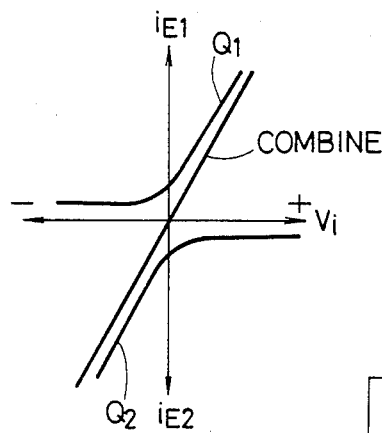
FIG. 5 is a graphical representation indicating characteristics of the circuit of FIG. 4.

The transfer characteristic of the circuit in FIG. 4 is as indicated in FIG. 5. That is, it can be understood that the circuit of FIG. 4 is a cutoffless class B SEPP circuit having a linear composite characteristic.

Figure 6:
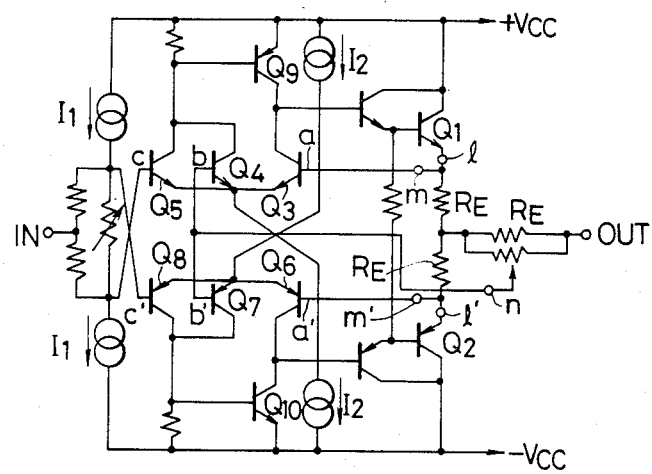
FIG. 6 is a circuit diagram showing a detailed example of the circuit of FIG. 4.

FIG. 6 shows a specific example of the circuit in FIG. 4. The error amplifier $A_1'$ is made up of transistors $Q_3$, $Q_4$ and $Q_5$. The bases of these transistors $Q_3$, $Q_4$ and $Q_5$ are employed as the input terminals a, b and c, respectively. The error amplifier $A_2'$ is made up of transistors $Q_6$, $Q_7$ and $Q_8$. The bases of the transistors $Q_6$, $Q_7$ and $Q_8$ are employed as the input terminals a', b' and c', respectively. The current generating units are made up of transistors $Q_9$ and $Q_{10}$. In FIG. 6, $I_1$ and $I_2$ designate constant current sources.

Figure 7:
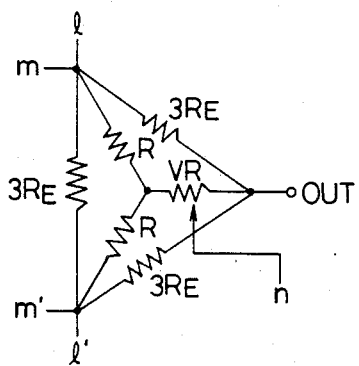
FIGS. 7 and 8 are circuit diagrams showing modifications of a part of the circuit of FIG. 6.
Figure 8:
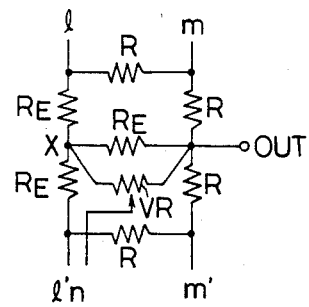

In FIG. 6, the output resistance circuit can be changed to a circuit as shown in FIG. 7 by wye-delta conversion. Furthermore, the resistance circuit may be changed to a bridge detection circuit as shown in FIG. 8. The rearrangement of the resistance circuit into the bridge detection circuit as shown in FIG. 8 is equivalent to the fact that the input terminals a and a' of the error amplifiers $A_1'$ and $A_2'$ in FIG. 4 are connected to the point X equivalently with respect to the signal component. Therefore, the distortion based on the unbalance due to variations of the emitter resistances $R_E$ is cancelled out. In this case, the output $v_o$ is obtained, as a modification of equation (5), as follows:

$$v_o = v_i - i_s \cdot R_S - \frac{V_{BE} + i_s R_E}{gm \cdot hie} . \qquad (6)$$

It can be understood that, when gm·hie is sufficiently large, $R_E$ is effectively cancelled out.

Figure 9:
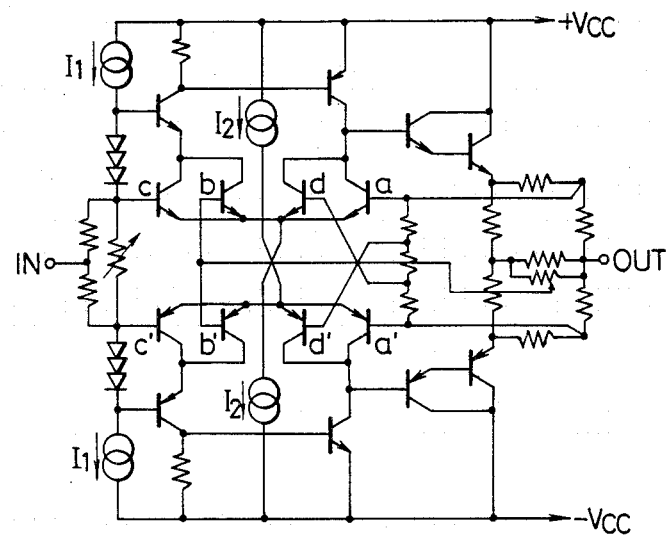
FIGS. 9 and 10 are circuit diagrams showing other examples of circuits according to the invention.
Figure 10:
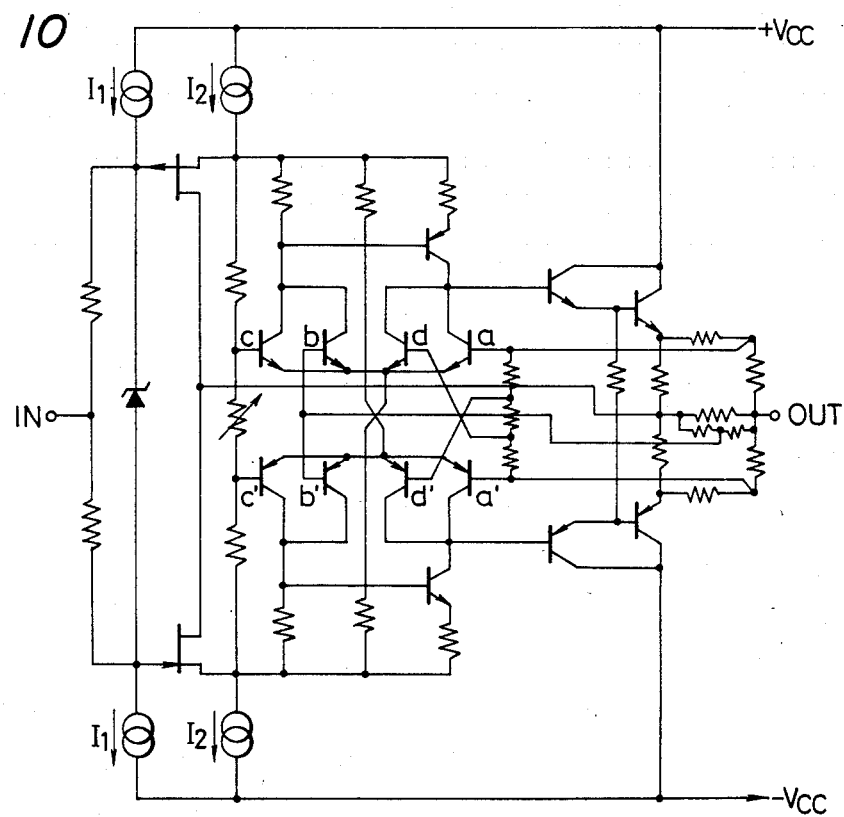

FIGS. 9 and 10 show other examples of a SEPP circuit according to the invention in which four-input-terminal error amplifiers are employed. In these examples, an ideal error amplification is carried out with the error amplifier section balanced.

In any one of the above-described examples, the bias applied across the input terminals c and c', b and b' or d and d' is, in practice, set to an optional value with which predetermined idle currents are obtained; that is, it is not limited to the value $V_B$ in FIG. 4.

In FIGS. 6, 9 and 10, the constant voltage drive points which are the input terminals of the circuit may be opened and the constant current sources $I_1$ may be converted into input signal sources, that is, constant current drive circuits, to obtain an SEPP circuit which carries out stabilization by idle servo and a cutoffless class B operation.

I claim:

1. An emitter-follower type SEPP circuit comprising:
   first and second amplifying elements connected in an emitter-follower and class B SEPP arrangement;
   first and second error amplifiers provided respectively for said first and second amplifying elements, each error amplifier having at least three input terminals one noninverting input terminal of which is connected to a circuit input terminal;
   first and second current generating means connected respectively between an output of said first error amplifier and an input terminal of said first amplifying element and between an output of said second error amplifier and the input terminal of said second amplifying element for producing a current; and
   a resistance network connected between a circuit output terminal and output terminals of said first and second amplifying elements, said resistance network having first and second idle current detecting terminals for detecting idle currents of said first and second amplifying elements, respectively, and a signal detecting terminal for detecting a signal output current,
   said first error amplifier amplifying an error voltage between a voltage at said first idle current detecting terminal and a voltage which provided by level-shifting a voltage at said circuit input terminal by a predetermined value,
   said second error amplifier amplifying an error voltage between a voltage at said second idle current detecting terminal and a voltage which provided by level-shifting a voltage at said circuit input terminal by a predetermined value, and
   at least one input terminal of each of said first and second error amplifiers being connected to said signal detecting terminal of said resistance network,
   wherein when said first error amplifier operates in response to an error voltage between a voltage at said first idle current detecting terminal and a voltage provided by level-shifting a voltage at said circuit input terminal, said second error amplifier operates in response to an error voltage between a voltage at said second idle current detecting terminal and a voltage which is provided by level-shifting a voltage at said signal detecting terminal, and
   when said second error amplifier operates in response to an error voltage between a voltage at said second idle current detecting terminal and a voltage provided by level-shifting a voltage at said circuit input terminal, said first error amplifier operates in response to an error voltage between a voltage at said first idle current detecting terminal and a voltage which is provided by level-shifting a voltage at said signal detecting terminal.

2. The emitter-follow type SEPP circuit of claim 1, further comprising level shifting means connected between said one noninverting input terminal and said circuit input terminal.

3. An emitter-follower type SEPP circuit comprising:
   first and second error amplifiers, each of said first and second error amplifiers having noninverting first and second input terminals and an inverting third input terminal;
   first and second constant current sources having respective first terminals coupled to outputs of said first and second error amplifiers;
   a bipolar NPN transistor having a base coupled to a second terminal of said first constant current source, a collector coupled to a positive power supply terminal, and an emitter coupled to said third input of said first error amplifier;
   a bipolar PNP transistor having a base coupled to a second terminal of said second constant current source, a collector coupled to a negative power supply terminal, and an emitter coupled to said third input of said second amplifier;

first through fourth bias potential sources, said first bias potential source having a negative terminal coupled to a signal input terminal and a positive terminal coupled to said first input terminal of said first error amplifier, said second bias potential source having a positive terminal coupled to said signal input terminal and a negative terminal coupled to said first input terminal of said second error amplifier, said third bias potential source having a positive terminal coupled to said second input terminal of said first error amplifier, and said fourth bias potential source having a negative terminal coupled to said second input terminal of said second error amplifier and a positive terminal coupled to a negative terminal of said third bias potential source; and resistance network means coupled between said emitters of said bipolar transistors and an output terminal, said resistance network means having a feedback terminal coupled to said negative terminal of said third bias potential source and said positive terminal of said fourth bias potential source.

4. The emitter-follower type SEPP circuit of claim 3, wherein said resistance network means comprises a first resistor having a first terminal coupled to said emitter of said first bipolar transistor, a second resistor having a first terminal coupled to said emitter of said second bipolar transistor and a second terminal coupled to a second terminal of said first resistor, a third resistor coupled between said second terminals of said first and second resistors and an output terminal, and voltage dividing means coupled across said third resistor for feeding back to said negative terminal of said third bias potential source and said positive terminal of said fourth bias potential source a predetermined proportion of a potential developed across said third resistor.

5. The emitter-follower type SEPP circuit of claim 4, wherein said voltage dividing means comprises a variable resistor.

6. The emitter-follower type SEPP circuit of claim 3, wherein said resistance network means comprises a delta-connected resistor circuit connected in parallel with a wye-connected resistor circuit, one terminal of the parallel connected circuits being coupled to said emitter of said first bipolar transistor, a second terminal of said parallel connected circuits being coupled to said emitter of said second bipolar transistor, and a third terminal of said parallel connected circuits being coupled to an output terminal, a resistor of said wye-connected resistor circuit being a variable resistor and having a variable tap terminal coupled to said negative terminal of said third bias potential source and said positive terminal of said fourth bias potential source.

7. The emitter-follower type SEPP circuit of claim 3, wherein said resistance network means comprises a bridge circuit and a variable resistor connected in parallel with a center resistor of said bridge circuit, a variable tap terminal of said variable resistor being coupled to said negative terminal of said third bias potential source and said positive terminal of said fourth bias potential source.

* * * * *